(12) United States Patent
Qian et al.

(10) Patent No.: US 7,888,763 B2
(45) Date of Patent: Feb. 15, 2011

(54) BACKSIDE ILLUMINATED IMAGING SENSOR WITH IMPROVED INFRARED SENSITIVITY

(75) Inventors: Yin Qian, Milpitas, CA (US); Howard E. Rhodes, San Martin, CA (US); Hsin-Chih Tai, Cupertino, CA (US); Vincent Venezia, Sunnyvale, CA (US); Duli Mao, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 178 days.

(21) Appl. No.: 12/203,858

(22) Filed: Sep. 3, 2008

(65) Prior Publication Data

US 2009/0200589 A1 Aug. 13, 2009

Related U.S. Application Data

(60) Provisional application No. 61/027,374, filed on Feb. 8, 2008.

(51) Int. Cl.
*H01L 31/00* (2006.01)
*H01L 21/00* (2006.01)

(52) U.S. Cl. ............. 257/460; 257/447; 257/E33.068
(58) Field of Classification Search ............. 257/447, 257/460, E33.068
See application file for complete search history.

(56) References Cited

U.S. PATENT DOCUMENTS 5,188,970 A * 2/1993 York et al. ............. 438/59
5,537,146 A * 7/1996 Tohyama ............. 348/311
5,801,400 A * 9/1998 Nishihata ............. 257/72
6,229,165 B1 * 5/2001 Sakai et al. ............. 257/291
6,429,036 B1 8/2002 Nixon et al.
6,501,065 B1 12/2002 Uppal et al.
6,657,194 B2 * 12/2003 Ashokan et al. ......... 250/338.4
6,797,957 B2 * 9/2004 Kawakubo et al. ....... 250/338.2
7,005,642 B2 * 2/2006 Nozu ............. 250/338.1
7,045,785 B2 * 5/2006 Iida et al. ............. 250/338.1
7,145,144 B2 * 12/2006 Nakaki et al. ......... 250/339.04
7,235,832 B2 6/2007 Yaung
7,259,364 B2 8/2007 Lulé
7,449,357 B2 * 11/2008 Kim et al. ............. 438/57
7,531,884 B2 * 5/2009 Kim ............. 257/440

(Continued)

FOREIGN PATENT DOCUMENTS

WO WO 97/18589 A1 5/1997
WO WO 99/00848 A1 1/1999

OTHER PUBLICATIONS

PCT/US2008/088332—International Search Report and Written Opinion, mailed Mar. 4, 2009.

(Continued)

*Primary Examiner*—Ida M Soward
(74) *Attorney, Agent, or Firm*—Blakely, Sokoloff, Taylor & Zafman, LLP

(57) ABSTRACT

A backside illuminated imaging sensor includes a semiconductor layer and an infrared detecting layer. The semiconductor layer has a front surface and a back surface. An imaging pixel includes a photodiode region formed within the semiconductor layer. The infrared detecting layer is disposed above the front surface of the semiconductor layer to receive infrared light that propagates through the imaging sensor from the back surface of the semiconductor layer.

22 Claims, 7 Drawing Sheets

U.S. PATENT DOCUMENTS

| | | | |
|---|---|---|---|
| 7,535,073 B2 * | 5/2009 | Ezaki | 257/440 |
| 7,588,993 B2 * | 9/2009 | Liu et al. | 438/401 |
| 7,659,595 B2 * | 2/2010 | Shiau et al. | 257/459 |
| 7,687,872 B2 * | 3/2010 | Cazaux et al. | 257/447 |
| 7,714,403 B2 * | 5/2010 | Lee et al. | 257/432 |
| 7,718,965 B1 * | 5/2010 | Syllaios et al. | 250/338.1 |
| 2007/0001100 A1 * | 1/2007 | Hsu et al. | 250/214.1 |
| 2007/0091190 A1 | 4/2007 | Iwabuchi et al. | |
| 2007/0259463 A1 | 11/2007 | Abedini | |
| 2008/0017893 A1 * | 1/2008 | Cazaux et al. | 257/233 |
| 2008/0224247 A1 * | 9/2008 | Hsu et al. | 257/432 |
| 2009/0212385 A1 * | 8/2009 | Ohkubo et al. | 257/443 |

OTHER PUBLICATIONS

Rosan, K., "Hydrogenated Amorphous-Silicon Image Sensors," IEEE Transactions on Electron Devices, vol. 36, No. 12, Dec. 1989, pp. 2923-2927.

* cited by examiner

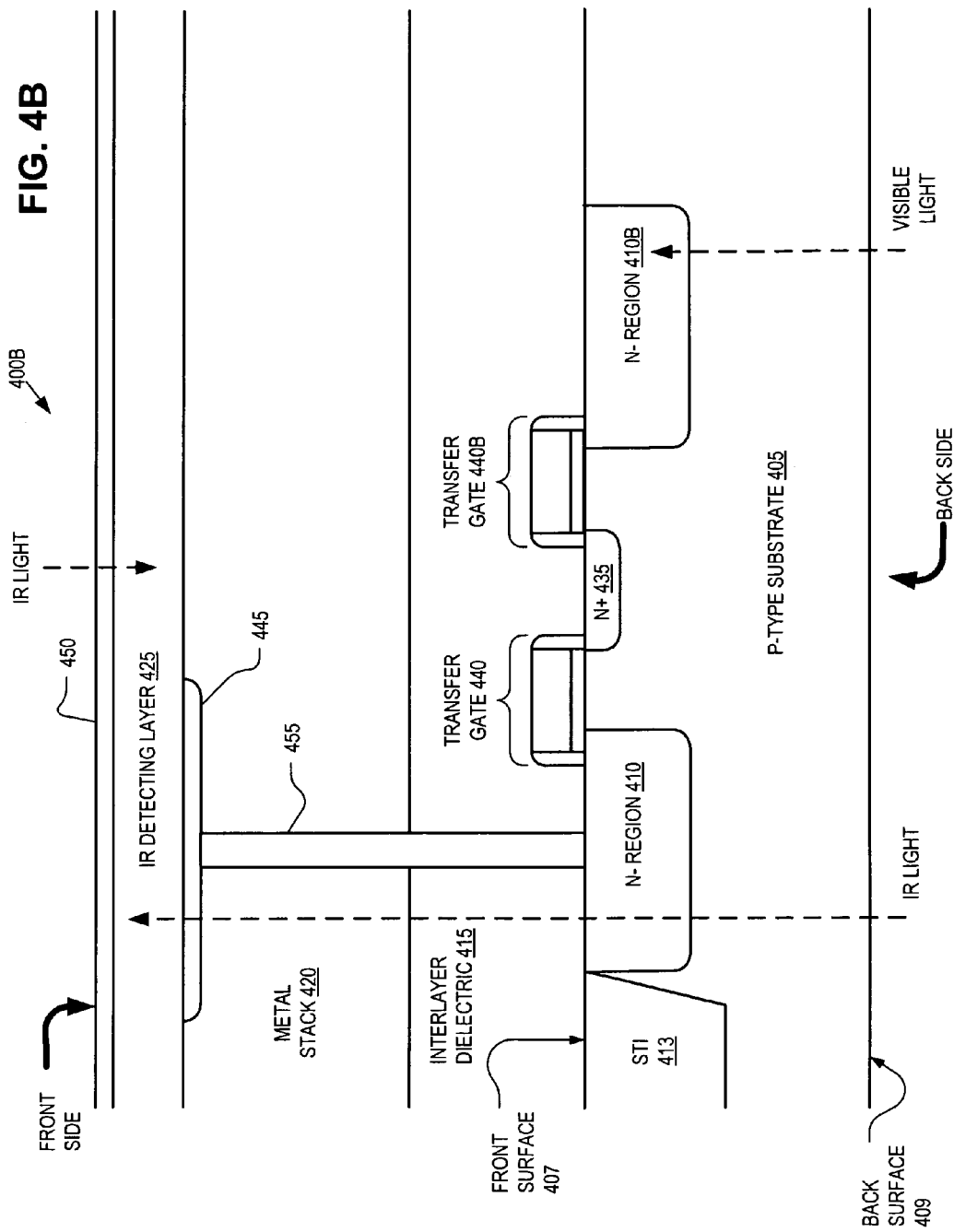

BACKSIDE ILLUMINATED IMAGING SENSOR WITH IMPROVED INFRARED SENSITIVITY

REFERENCE TO PRIOR APPLICATION

This application claims the benefit of U.S. Provisional Application No. 61/027,374, filed Feb. 8, 2008, hereby incorporated by reference.

TECHNICAL FIELD

This disclosure relates generally to imaging sensors, and in particular but not exclusively, relates to backside illuminated imaging sensors.

BACKGROUND INFORMATION

Many semiconductor imaging sensors today are front side illuminated. That is, they include imaging arrays that are fabricated on the front side of a semiconductor wafer, where light is received at the imaging array from the same front side. However, front side illuminated imaging sensors have many drawbacks, one of which is a limited fill factor.

Backside illuminated imaging sensors are an alternative to front side illuminated imaging sensors that address the fill factor problems associated with front side illumination. Backside illuminated imaging sensors include imaging arrays that are fabricated on the front surface of the semiconductor wafer, but receive light through a back surface of the wafer. Color filters and micro-lenses may be included on the back surface of the wafer in order to improve the sensitivity of the backside illuminated sensor. However, to detect light from the backside, the wafer must be extremely thin. The thickness of the wafer may also be reduced in order to improve the sensitivity. Thus, the photodiode must be very close to the back surface of the sensor in order to generate and collect charge. However, infrared radiation is absorbed much deeper in the silicon than it is with visible light. A substantial amount of infrared light passes through the thinned silicon substrate and does not generate a related charge. Therefore, there is a tradeoff between visible light and infrared sensitivities with backside illuminated imaging sensors.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIG. 4B is a cross-sectional view of an imaging pixel of a backside illuminated imaging sensor, in accordance with an embodiment of the invention.

DETAILED DESCRIPTION

Embodiments of a Backside Illuminated Imaging Sensor with Improved Infrared Sensitivity are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In general, embodiments disclosed herein include a backside illuminated imaging sensor that includes an additional infrared sensor for improving low light performance. The addition of an additional infrared sensor further allows the improved detection of both visible and infrared light.

Figure 1:
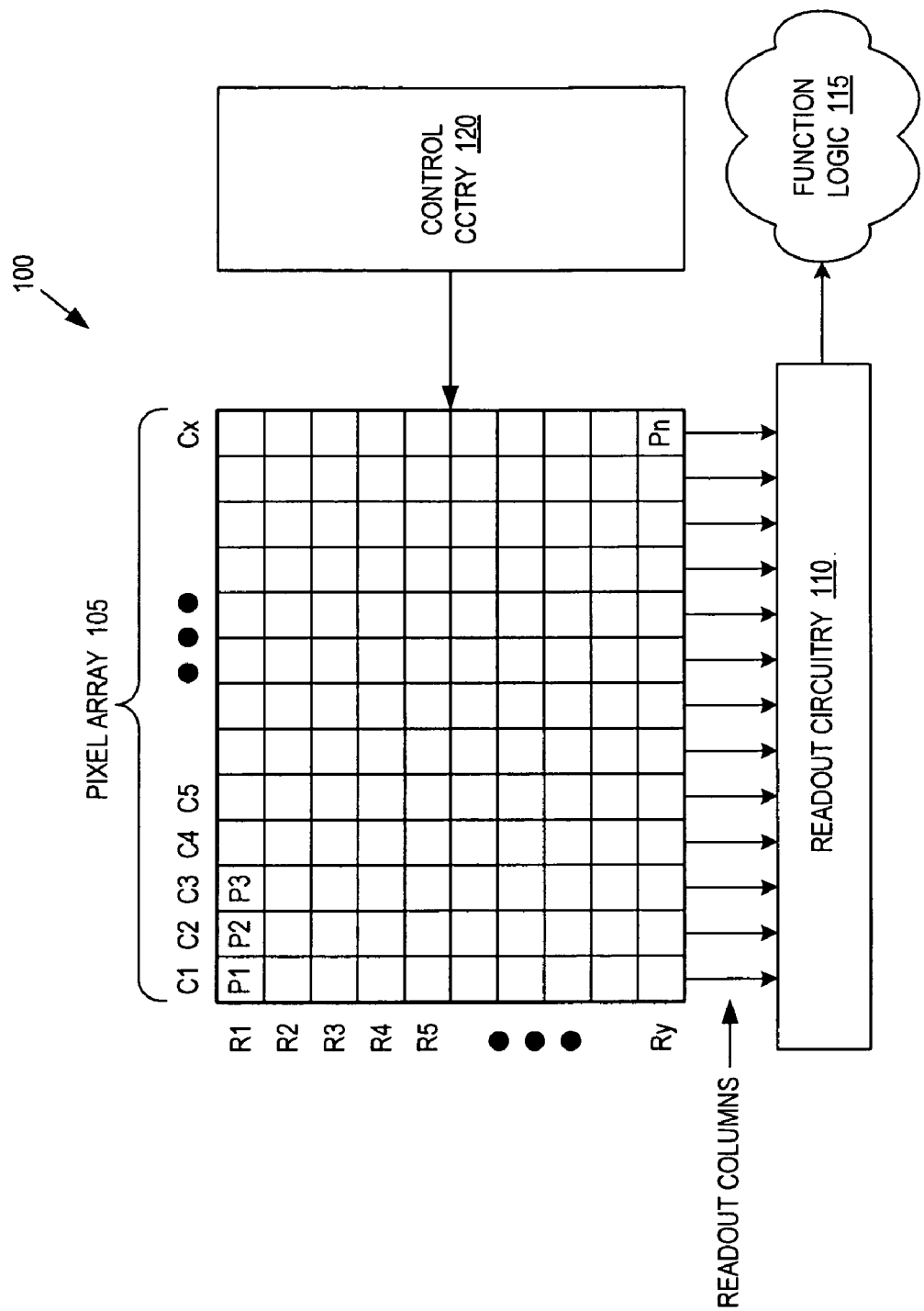
FIG. 1 is a block diagram illustrating a backside illuminated imaging sensor, in accordance with an embodiment of the invention.

FIG. 1 is a block diagram illustrating a backside illuminated imaging sensor 100, in accordance with an embodiment of the invention. The illustrated embodiment of imaging sensor 100 includes a pixel array 105, readout circuitry 110, function logic 115, and control circuitry 120.

Pixel array 105 is a two-dimensional ("2D") array of backside illuminated imaging sensors or pixels (e.g., pixels P1, P2 . . . , Pn). In one embodiment, each pixel is an active pixel sensor ("APS"), such as a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 110 and transferred to function logic 115. Readout circuitry 110 may include amplification circuitry, analog-to-digital conversion circuitry, or otherwise. Function logic 115 may simply store the image data or even manipulate the image data by applying post image effects (e.g., crop, rotate, remove red eye, adjust brightness, adjust contrast, or otherwise). In one embodiment, readout circuitry 110 may readout a row of image data at a time along readout column lines (illustrated) or may readout the image data using a variety of other techniques (not illustrated), such as a serial readout or a full parallel readout of all pixels simultaneously.

Control circuitry 120 is coupled to pixel array 105 to control operational characteristic of pixel array 105. For example, control circuitry 120 may generate a shutter signal for controlling image acquisition.

Figure 2:
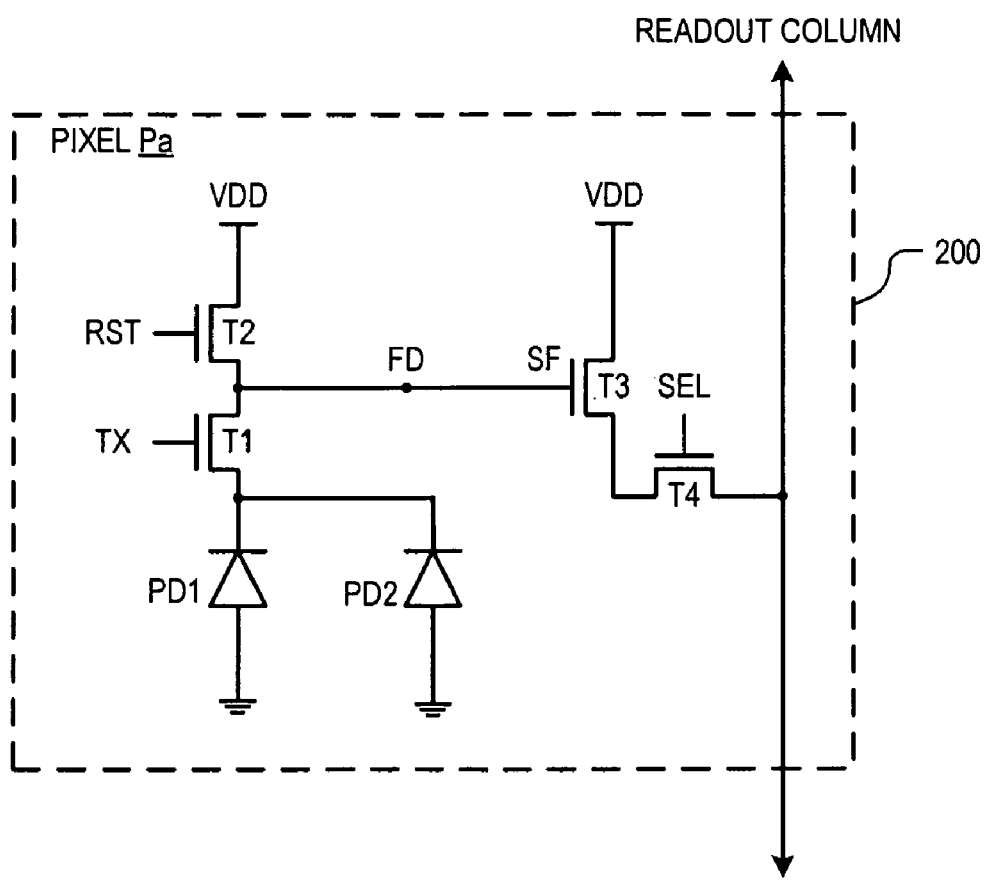
FIG. 2 is a circuit diagram illustrating pixel circuitry of a pixel within a backside illuminated imaging sensor, in accordance with an embodiment of the invention.

FIG. 2 is a circuit diagram illustrating pixel circuitry 200 of a pixel Pa within a backside illuminated imaging array, in accordance with an embodiment of the invention. Pixel circuitry 200 is one possible pixel circuitry architecture for implementing each pixel within pixel array 100 of FIG. 1. Although FIG. 2 illustrates a 4T pixel architecture, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures.

In FIG. 2, pixel Pa includes a first photodiode PD1, a second photodiode PD2, a transfer transistor T1, a reset transistor T2, a source-follower ("SF") transistor T3, and a select transistor T4. During operation, transfer transistor T1 receives a transfer signal TX, which transfers the charge accumulated in both photodiodes PD1 and PD2 to a floating diffusion node FD. In one embodiment, photodiode PD1 is configured to be primarily responsive to infrared light. For example, PD1 may be a photodiode formed from amorphous silicon (a-Si). In one embodiment, photodiode PD2 is configured to be responsive to visible light. For example, PD1 may be a diode formed from silicon (Si).

Reset transistor T2 is coupled between a power rail VDD and the floating diffusion node FD to reset (e.g., discharge or charge the FD to a preset voltage) under control of a reset signal RST. The floating diffusion node FD is coupled to the gate of SF transistor T3. SF transistor T3 is coupled between the power rail VDD and select transistor T4. SF transistor T3 operates as a source-follower providing a high impedance output from floating diffusion node FD. Finally, select transistor T4 selectively couples the output of pixel circuitry 200 to the readout column line under control of a select signal SEL. In one embodiment, the TX signal, the RST signal, and the SEL signal are generated by control circuitry 120.

Figure 3:
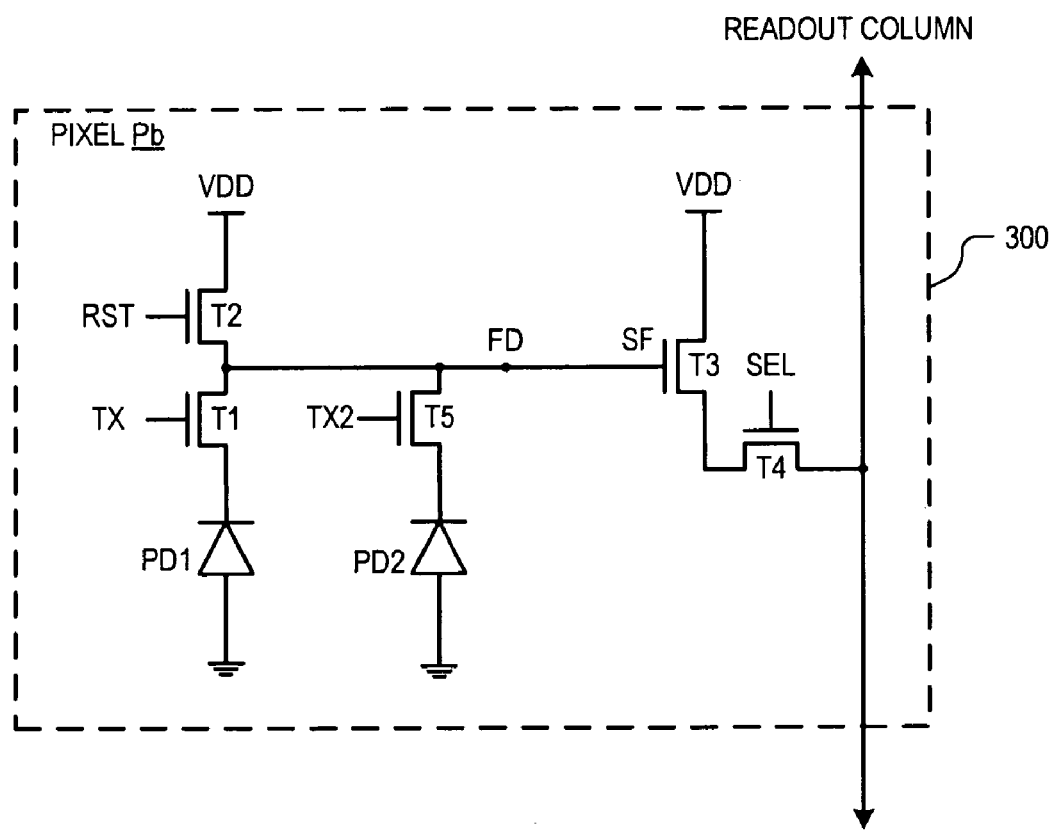
FIG. 3 is a circuit diagram illustrating pixel circuitry of a pixel within a backside illuminated imaging sensor, in accordance with an embodiment of the invention.

FIG. 3 is a circuit diagram illustrating pixel circuitry 300 of a pixel Pb within a backside illuminated imaging array, in accordance with an embodiment of the invention. Pixel circuitry 300 is one possible pixel circuitry architecture for implementing each pixel within pixel array 100 of FIG. 1.

In FIG. 3, pixel Pb includes a first photodiode PD1, a second photodiode PD2, a first transfer transistor T1, a reset transistor T2, a source-follower ("SF") transistor T3, a select transistor T4, and a second transfer transistor T5. During operation, first transfer transistor T1 receives a first transfer signal TX, which transfers the charge accumulated in photodiodes PD1 to a floating diffusion node FD. Second transfer transistor T2 receives a second transfer signal TX2, which transfers the charge accumulated in photodiode PD2 to the floating diffusion node FD. In one embodiment, photodiode PD1 is configured to be primarily responsive to infrared light. In one embodiment, photodiode PD2 is configured to be responsive to visible light.

Figure 4A:
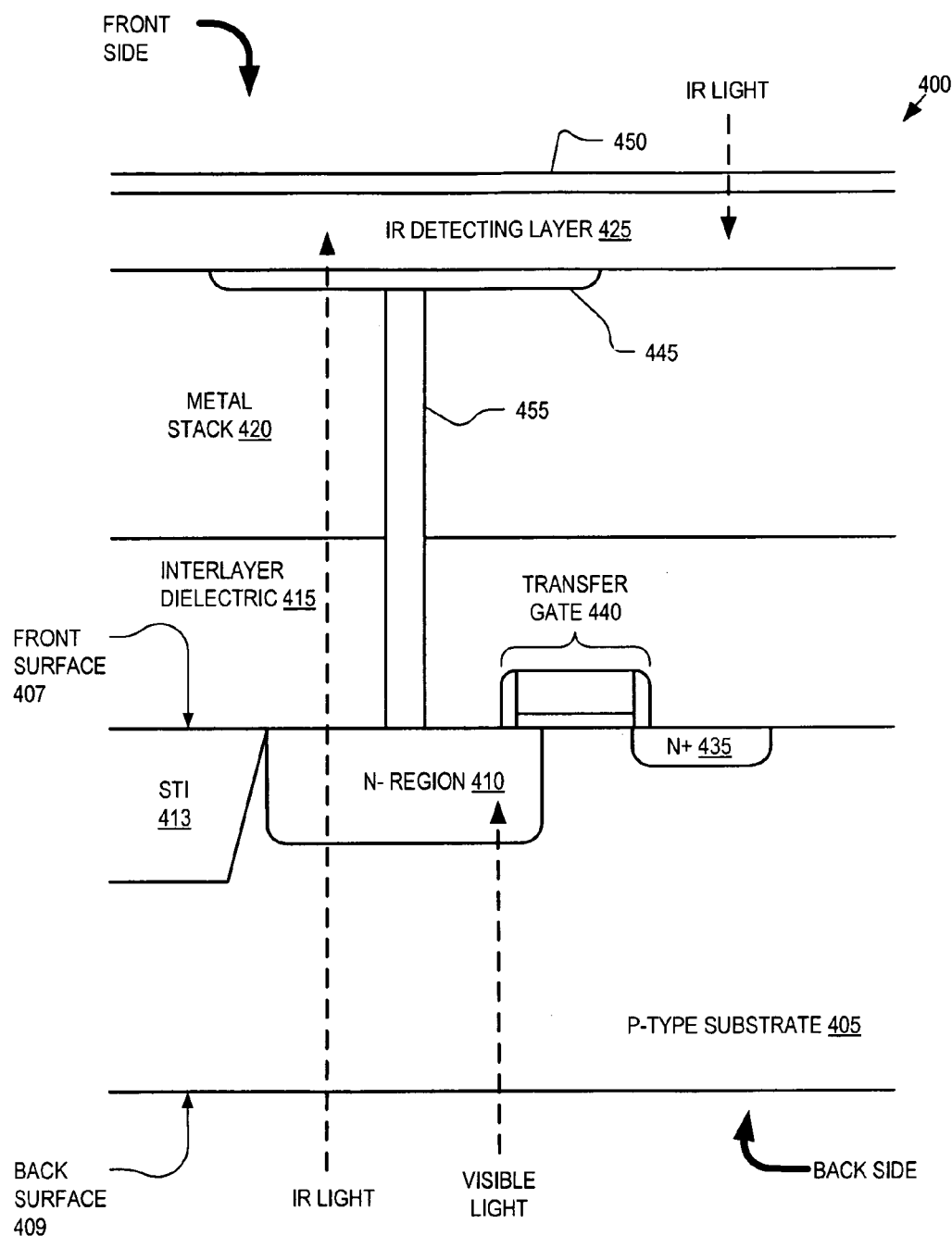
FIG. 4A is a cross-sectional view of an imaging pixel of a backside illuminated imaging sensor, in accordance with an embodiment of the invention.

FIG. 4A is a cross-sectional view of an imaging pixel 400 of a backside illuminated imaging sensor, in accordance with an embodiment of the invention. Imaging pixel 400 is one possible implementation of at least one pixel of pixel array 105 shown in FIG. 1 and is also one possible implementation of at least a portion of the pixel circuitry 200 of FIG. 2. The illustrated embodiment of imaging pixel 400 includes a semiconductor layer (i.e., P-type substrate 405), interlayer dielectric 415, metal stack 420, infrared detecting layer 425, conductive layers 445 and 450, and a via 455. Formed within substrate 405 is a photodiode (i.e., N− region 410), a shallow trench isolation ("STI") 413, a transfer gate 440, and a floating diffusion (i.e., N+ region 435).

Backside illuminated imaging sensors require thinning of the backside of the substrate. This is because visible light is absorbed near back surface 409. Thus, N− region 410 must be relatively close to back surface 409 in order to generate and collect charge. Infrared light, however, is absorbed much deeper in Silicon. Thus, a substantial amount of infrared light passes through thinned substrate 405 and does not generate a related charge in N− region 410. However, the addition of IR detecting layer 425 improves the infrared sensitivity of imaging pixel 400 by detecting this IR light received through the backside of imaging pixel 400.

In one embodiment, IR detecting layer 425 includes a photodiode formed within a layer of Hydrogenated amorphous silicon (a-Si:H). In one example, a thickness of the layer of a-Si:H (e.g., IR detecting layer 425) is in the range of approximately 200 nm to approximately 2 um. In another example, the thickness of the layer of a-Si:H is dependent on the quality of the a-Si:H. As shown in FIG. 4 IR detecting layer 425 is disposed above metal stack 420 on the front side of imaging pixel 400. However, in other embodiments, IR detecting layer 425 may be disposed within metal stack 420 or alternatively, between metal stack 420 and interlayer dielectric 415.

Imaging pixel 400 further includes conductive layer 445 and via 455 for electrically coupling IR detecting layer 425 to N− region 410. In this manner, transfer gate 440 may be used to transfer charge accumulated in both IR detecting layer 425 and N− region 410 to floating node (i.e., N+ region 435). In one embodiment, conductive layer 445 and/or via 455 may be optically transparent to infrared light. For example, conductive layer 445 may be a layer of indium tin oxide ("ITO"). In another example, conductive layer 445 may be a layer of tin oxide.

Also included in imaging pixel 400 is conductive layer 450. Conductive layer 450 is coupled to the front side of IR detecting layer 425 so as to provide an electrical connection for coupling to metal stack 420. For example, a hole or via (not shown) may be formed within IR detecting layer 425 for electrically coupling conductive layer 450 to metal stack 420. In one embodiment, conductive layer 450 is opaque to infrared light. In this embodiment, infrared light received from the back side of imaging pixel 400 that is not absorbed by IR detecting layer 425 may be reflected back into IR detecting layer 425 so as to increase the efficiency of imaging pixel 400. In another embodiment, conductive layer 450 is transparent to infrared light. In this embodiment of an IR transparent conductive layer 450, IR detecting layer 425 is configured to generate and accumulate charge in response to IR light that is received from both the back side and from the front side of imaging pixel 400.

In one embodiment, N− region 410 is configured to accumulate charge in response to visible light, while IR detecting layer 425 is configured to accumulate charge in response to infrared light.

FIG. 4B is a cross-sectional view of an imaging pixel 400B of a backside illuminated imaging sensor, in accordance with an embodiment of the invention. Imaging pixel 400B is one possible implementation of at least one pixel of pixel array 105 shown in FIG. 1 and is also one possible implementation of at least a portion of the pixel circuitry 300 of FIG. 3. The illustrated embodiment of imaging pixel 400B includes a semiconductor layer (i.e., P-type substrate 405), interlayer dielectric 415, metal stack 420, infrared detecting layer 425, conductive layers 445 and 450, and via 455. Formed within substrate 405 are photodiodes (i.e., N− regions 410 and 410B), a shallow trench isolation ("STI") 413, transfer gates 440 and 440B, and a floating diffusion (i.e., N+ region 435).

Imaging pixel 400B further includes conductive layer 445 and via 455 for electrically coupling IR detecting layer 425 to N− region 410. In this manner, transfer gate 440 may be used to transfer charge accumulated in IR detecting layer 425 to floating node (i.e., N+ region 435). Similarly, transfer gate 440B may be used to transfer charge accumulated in N− region 410B to the floating node.

In one embodiment, N− region 410B is configured to accumulate charge in response to visible light, while IR detecting layer 425 is configured to accumulate charge in response to infrared light.

Figure 5:
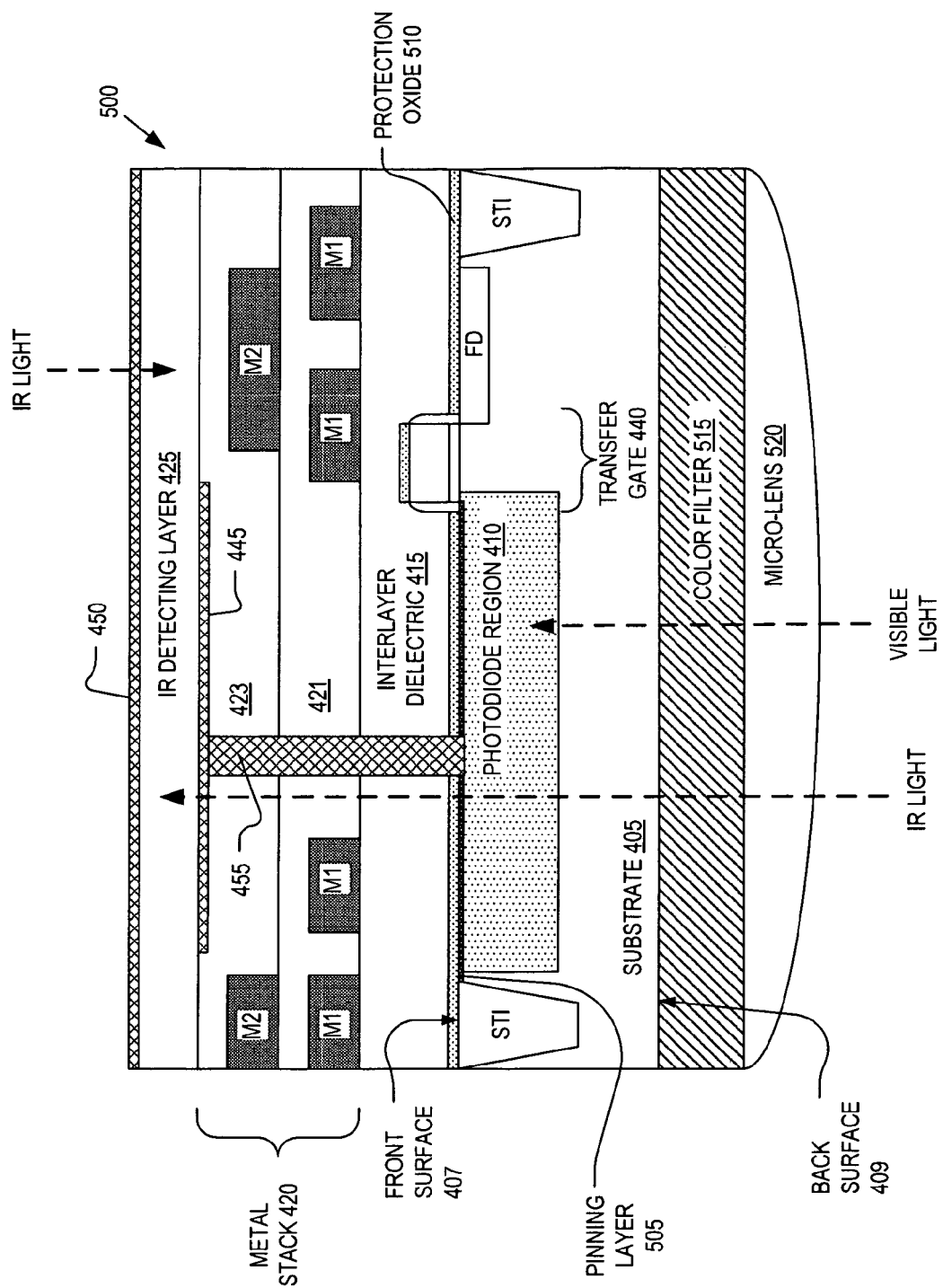
FIG. 5 is a cross-sectional view of an imaging pixel of a backside illuminated imaging sensor, in accordance with an embodiment of the invention.

FIG. 5 is a cross-sectional view of an imaging pixel 500 of a backside illuminated imaging sensor, in accordance with an embodiment of the invention. Imaging pixel 500 is one possible implementation of at least one pixel of pixel array 105 shown in FIG. 1. The illustrated embodiment of imaging pixel 500 includes semiconductor layer (i.e., substrate 405), interlayer dielectric 415, metal stack 420, infrared detected layer 425, conductive layers 445 and 450, via 455, color filter 515, and microlens 520. Metal stack 420 is illustrated as including metal interconnect layers M1 and M2, and intermetal dielectric layers 421 and 423.

In the illustrated embodiment of FIG. 5, photodiode region 410 is formed within semiconductor substrate 405 and is configured to receive light from back surface 409. Photodiode region 410 is illustrated as a pinned photodiode by way of optional pinning layer 505. In one embodiment, photodiode region 410 may be an unpinned photodiode or a partially pinned photodiode. Additionally, photodiode region 410 may be any photosensitive element, such as a photogate or photocapacitor. Furthermore, the term pixel as used herein is meant to encompass all pixel designs, including CCD pixels.

Coupled to back surface 409 is an optional color filter 515 to implement a color sensor and micro-lens 520 to focus light onto photodiode region 410. Coupled to front surface 407 is protection oxide 510 and interlayer dielectric 415. In one embodiment interlayer dielectric 415 is silicon oxide. Also included in imaging pixel 500 is transfer gate 440 which is coupled to transfer charge that is accumulated in photodiode region 410 and IR detecting layer 425 to floating diffusion FD. In one embodiment, transfer gate 440 is a polycrystalline silicon (i.e., polysilicon) structure.

As shown in FIG. 5, imaging pixel 500 includes metal stack 420. The illustrated embodiment of metal stack 420 includes two metal layers M1 and M2 separated by intermetal dielectric layers 421 and 423. Although FIG. 5 illustrates a two layer metal stack, metal stack 420 may include more or less metal layers for routing signals above front surface 407 of substrate 405. In one embodiment metal interconnect layers M1 and M2 are a metal such as aluminum, copper, or other alloy. In one embodiment, metal interconnect layers M1 and M2 are formed by way of sputtering, collimated sputtering, low pressure sputtering, reactive sputtering, electroplating, chemical vapor deposition or evaporation. In one embodiment, transfer gate 440 and floating diffusion FD are electrically coupled to one or more of metal interconnect layers M1 and M2 by way of a hole, via or other connection means (not shown) through protection oxide 510 and interlayer dielectric 415.

During operation, an optical signal which includes infrared light and visible light is received at micro-lens 520, which focuses the optical signal through color filter 515 to back surface 409 and through substrate 405 to be received by photodiode region 410. As mentioned previously, the infrared light may continue propagating through imaging pixel 500 to IR detecting layer 425. Electron-hole pairs are then generated in response to the received visible and infrared light. The electrons are then collected in photodiode region 410 and IR detecting layer 425, transferred to the floating diffusion (FD), and converted into electrical signals, which are then routed through peripheral circuitry and one or more of the metal layers of metal stack 420.

Figure 6:
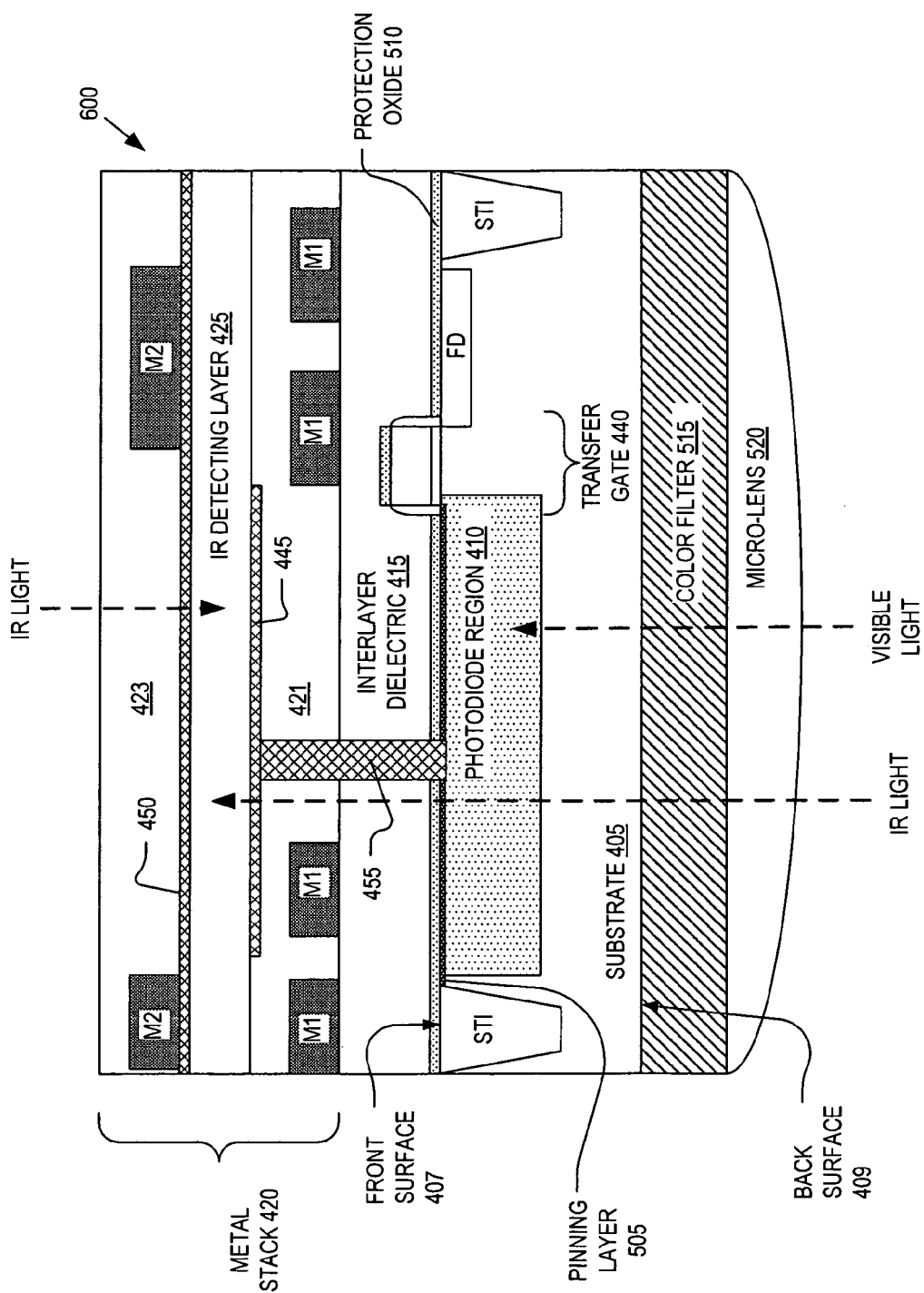
FIG. 6 is a cross-sectional view of an imaging pixel of a backside illuminated imaging sensor, in accordance with an embodiment of the invention.

FIG. 6 is a cross-sectional view of an imaging pixel 600 of a backside illuminated imaging sensor, in accordance with an embodiment of the invention. Imaging pixel 600 is one possible implementation of at least one pixel of pixel array 105 shown in FIG. 1. The illustrated embodiment of imaging pixel 600 includes semiconductor layer (i.e., substrate 405), interlayer dielectric 415, metal stack 420, infrared detected layer 425, conductive layers 445 and 450, via 455, color filter 515, and microlens 520.

As shown in FIG. 6, infrared detecting layer 425 is disposed between metal interconnect layers M1 and M2, for situations where it may not be desirable or possible to put the infrared detecting layer 425 above metal stack 420. Although FIG. 6 illustrates infrared detecting layer 425 as between the M1 and M2 layers, infrared detecting layer 425 may alternatively be disposed between any layers of a metal stack 420 and may also be disposed between metal stack 420 and interlayer dielectric 415.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A backside illuminated imaging sensor, comprising:
    a semiconductor layer having a front surface and a back surface, the semiconductor layer having an imaging pixel that includes a photodiode region formed within the semiconductor layer;
    an infrared detecting layer disposed above the front surface of the semiconductor layer to receive infrared light that propagates through the imaging sensor from the back surface of the semiconductor layer; and
    a metal conducting layer coupled to the infrared detecting layer.

2. The backside illuminated imaging sensor of claim 1, wherein the infrared detecting layer is a layer of Hydrogenated amorphous silicon (a-Si:H).

3. The backside illuminated imaging sensor of claim 1, wherein the metal conducting layer is disposed between the infrared detecting layer and the semiconductor layer.

4. The backside illuminated imaging sensor of claim 1, wherein the infrared detecting layer is disposed between the metal conducting layer and the semiconductor layer.

5. The backside illuminated imaging sensor of claim 1, wherein the imaging pixel further includes:
    a floating diffusion region formed within the semiconductor layer; and
    a transfer gate coupled between the photodiode region and the floating diffusion; wherein the transfer gate is configured to transfer charge accumulated in the infrared detecting layer to the floating diffusion and is further configured to transfer charge accumulated in the photodiode region to the floating diffusion.

6. The backside illuminated imaging sensor of claim 1, wherein the photodiode region is a first N+ region formed within the semiconductor layer, the imaging pixel further including:
- a second N+ region formed within the semiconductor layer;
- a floating diffusion region formed within the semiconductor layer;
- a first transfer gate coupled between the first N+ region and the floating diffusion region to transfer charge accumulated in the infrared detecting layer to the floating diffusion; and
- a second transfer gate coupled between the second N+ region and the floating diffusion to transfer charge accumulated in the second N+ region to the floating diffusion.

7. The backside illuminated imaging sensor of claim 1, wherein the imaging pixel is a complementary metal-oxide-semiconductor ("CMOS") backside illuminated imaging pixel.

8. The backside illuminated imaging sensor of claim 1, further comprising:
- a micro-lens disposed on the back surface of the semiconductor layer below the photodiode region and optically aligned to focus light through the back surface of the semiconductor layer onto the photodiode region; and
- a color filter disposed between the micro-lens and the photodiode region to filter the light.

9. A backside illuminated imaging sensor, comprising:
- a semiconductor layer having a front surface and a back surface, the semiconductor layer having an imaging pixel that includes a photodiode region formed within the semiconductor layer;
- an infrared detecting layer disposed above the front surface of the semiconductor layer to receive infrared light that propagates through the imaging sensor from the back surface of the semiconductor layer; and
- a conductive layer coupled to the infrared detecting layer to electrically couple the infrared detecting layer to the photodiode region, wherein the conductive layer is transparent to at least the infrared light.

10. The backside illuminated imaging sensor of claim 9, wherein the conductive layer is a layer of indium tin oxide.

11. The backside illuminated imaging sensor of claim 9, wherein the conductive layer is a layer of tin oxide.

12. The backside illuminated imaging sensor of claim 9, wherein the conductive layer is a first conductive layer, the imaging sensor further comprising a second conductive layer disposed on a surface of the infrared detecting layer opposite the first conductive layer, wherein the second conductive layer is to electrically couple the infrared detecting layer to the photodiode region.

13. The backside illuminated imaging sensor of claim 12, wherein the second conductive layer is transparent to infrared light received from a front side of the imaging sensor, wherein the infrared detecting layer is configured to detect infrared light received from the front side of the imaging sensor and infrared light received from the back surface of the semiconductor layer.

14. The backside illuminated imaging sensor of claim 9, wherein the imaging pixel further includes:
- a floating diffusion region formed within the semiconductor layer; and
- a transfer gate coupled between the photodiode region and the floating diffusion; wherein the transfer gate is configured to transfer charge accumulated in the infrared detecting layer to the floating diffusion and is further configured to transfer charge accumulated in the photodiode region to the floating diffusion.

15. The backside illuminated imaging sensor of claim 9, wherein the photodiode region is a first N+ region formed within the semiconductor layer, the imaging pixel further including:
- a second N+ region formed within the semiconductor layer;
- a floating diffusion region formed within the semiconductor layer;
- a first transfer gate coupled between the first N+ region and the floating diffusion region to transfer charge accumulated in the infrared detecting layer to the floating diffusion; and
- a second transfer gate coupled between the second N+ region and the floating diffusion to transfer charge accumulated in the second N+ region to the floating diffusion.

16. An imaging sensor, comprising:
- a semiconductor layer having a front surface and a back surface, the semiconductor layer having a backside illuminated array of imaging pixels, wherein each imaging pixel includes:
  - a photodiode region formed within the semiconductor layer;
  - an infrared detecting layer disposed above the front surface of the semiconductor layer to receive infrared light that propagates through the imaging sensor from the back surface of the semiconductor layer; and
  - a conductive layer coupled to the infrared detecting layer to electrically couple the infrared detecting layer to the photodiode region, wherein the conductive layer is transparent to at least the infrared light.

17. The imaging sensor of claim 16, wherein the infrared detecting layer is a layer of Hydrogenated amorphous silicon (a-Si:H).

18. The imaging sensor of claim 16, wherein the conductive layer is a first conductive layer, the imaging sensor further comprising a second conductive layer disposed on a surface of the infrared detecting layer opposite the first conductive layer, wherein the second conductive layer is to electrically couple the infrared detecting layer to the photodiode region.

19. The imaging sensor of claim 18, wherein the second conductive layer is transparent to infrared light received from a front side of the imaging sensor, wherein the infrared detecting layer is configured to detect infrared light received from the front side of the imaging sensor and infrared light received from the back surface of the semiconductor layer.

20. The imaging sensor of claim 16, wherein each imaging pixel further includes:
- a floating diffusion region formed within the semiconductor layer; and
- a transfer gate coupled between the photodiode region and the floating diffusion; wherein the transfer gate is configured to transfer charge accumulated in the infrared detecting layer to the floating diffusion and is further configured to transfer charge accumulated in the photodiode region to the floating diffusion.

21. The imaging sensor of claim 16, wherein the photodiode region of each imaging pixel is a first N+ region formed within the semiconductor layer, each imaging pixel further including:
- a second N+ region formed within the semiconductor layer;

a floating diffusion region formed within the semiconductor layer;
a first transfer gate coupled between the first N+ region and the floating diffusion region to transfer charge accumulated in the infrared detecting layer to the floating diffusion; and
a second transfer gate coupled between the second N+ region and the floating diffusion to transfer charge accumulated in the second N+ region to the floating diffusion.

22. The imaging sensor of claim 16, wherein each imaging pixel is a complementary metal-oxide-semiconductor ("CMOS") backside illuminated imaging pixel.

* * * * *